United States Patent [19]

Koskenmaki et al.

[11] Patent Number: 5,366,140
[45] Date of Patent: Nov. 22, 1994

[54] PATTERNED ARRAY OF UNIFORM METAL MICROBEADS

[75] Inventors: David C. Koskenmaki, St. Paul; Clyde D. Calhoun, Grant Township, Washington County, both of Minn.

[73] Assignee: Minnesota Mining and Manufacturing Company, St. Paul, Minn.

[21] Appl. No.: 129,668

[22] Filed: Sep. 30, 1993

[51] Int. Cl.$^5$ ...................... B23K 35/00; B23K 35/14
[52] U.S. Cl. ................................. 228/246; 228/56.3; 427/123; 427/375; 427/383.1; 156/241
[58] Field of Search ................. 228/180.22, 245, 246, 228/41, 56.3; 156/241, 297; 427/123, 375, 383.1

[56] References Cited

U.S. PATENT DOCUMENTS

| | | | |
|---|---|---|---|
| 2,822,509 | 5/1953 | Harvey | 317/2 |
| 4,000,334 | 10/1976 | Hallman et al. | 427/56 |
| 4,097,266 | 6/1978 | Takahashi et al. | 428/570 |
| 4,242,439 | 12/1980 | Izu et al. | 430/346 |
| 4,267,261 | 5/1981 | Hallman et al. | 430/322 |
| 4,606,962 | 8/1986 | Reylek | 428/148 |
| 4,814,040 | 3/1989 | Ozawa | 156/634 |
| 5,026,599 | 6/1991 | Koskenmaki | 428/328 |
| 5,120,678 | 6/1992 | Moore et al. | 228/180.22 |
| 5,185,178 | 2/1993 | Koskenmaki | 427/585 |

*Primary Examiner*—Samuel M. Heinrich
*Attorney, Agent, or Firm*—Gary L. Griswold; Walter N. Kirn; H. Sanders Gwin, Jr.

[57] ABSTRACT

The present invention provides a method for providing an array of metal microbeads on a substrate, preferably in a regular pattern of very fine, uniform size microspheres or microbeads at precise spacing or scale previously unachievable. The method of the present invention comprises the steps of providing a metal layer on a substrate that is partitioned into metal regions; heating the metal layer to a temperature sufficient to melt the metal and to permit beading of the layer into discrete microbeads.

18 Claims, 5 Drawing Sheets

PATTERNED ARRAY OF UNIFORM METAL MICROBEADS

TECHNICAL FIELD

The present invention relates to a method for forming a patterned array of metal microbeads on a substrate and particularly to a method of providing a regular array having precise spacing.

BACKGROUND OF INVENTION

In the electronic equipment and telecommunications industries there are strenuous requirements for making electrical connection between components, often on a very small scale. Semiconductors, such as integrated circuits, are formed on wafers which are then cut into dice or chips that individually may be mounted on substrates. Typically, the substrate has fine electrically conductive circuit lines, and electrical and thermal contact must be made between the substrate and chip. As electronic appliances, such as computers, tape players, televisions, telephones, and other appliances become smaller, thinner, and more portable, the size requirements for semiconductors and the means for providing electrical connection between semiconductors and substrates, or between flexible circuits and rigid printed circuits, becomes increasingly demanding.

One method for providing electrical conductivity between two electrical elements such as between flexible circuits and printed circuits, is through the use of a Z-axis adhesive. A Z-axis adhesive (e.g. U.S. Pat. Nos. 2,822,509 and 4,606,962) typically consists of conductive particles dispersed throughout an adhesive film. When a Z-axis adhesive is used to bond together arrays of conductive elements on two insulating substrates, contact between the conductive elements is made by the conductive particles. As the demands for miniaturization continue to increase, spacing between particles and precision in spacing between particles becomes increasingly important.

A Z-axis adhesive can be made by randomly dispersing conductive metal particles in an adhesive. By randomly dispersing conductive metal particles in an adhesive, the resulting Z-axis adhesive will have random distances between individual particles, including particles touching each other. In order to provide the desired density for electrical connection of the electrical elements, sufficient particles must be loaded into the adhesive to insure that Z-axis conductivity will occur as required. It is typically necessary to load excess particles so that the maximum random gap between particles does not exceed the spacing requirements for interconnection. The random loading of conductive particles causes clumping of particles which will cause shorting of electrical elements. Therefore, it is important to be able to provide positioned conductive particles.

Accordingly, there is a need for a method for providing a patterned array of uniform metal microbeads on a substrate with spacing and precision previously unattainable. There is a need for a method that provides a regular pattern of very fine, uniform size microspheres or microbeads at precise spacing or scale previously unachievable. Such arrays can be used, for example, in a Z-axis adhesive.

SUMMARY OF THE INVENTION

The present invention provides a method for providing an array of metal microbeads on a substrate. The present invention also provides a substrate, such as a polymeric substrate, having a discontinuous metal coating, the metal coating comprising a patterned array of closely-spaced metal microbeads, the metal microbeads having a spherical portion and a flat portion.

The method of the present invention comprises the steps of providing a metal layer on a substrate that is partitioned into metal regions; contacting the metal layer with an effective amount of a fluxing agent, as needed; heating the metal layer to a temperature sufficient to melt the metal and to permit beading of the layer into discrete microbeads. The metal layer may be deposited on the substrate so as to be partitioned when deposited, thus requiring no specific partitioning step, or deposited as a continuous layer and then partitioned. The metal regions do not necessarily need to be discrete, but only sufficiently partitioned to permit beading. Fluxing is needed only if an oxide layer is present.

The microbeads of the present invention may have a wide range of diameters. Typical average diameters are in the range of about 0.2 $\mu$m to about 100 $\mu$m, and more preferably 1 $\mu$m to about 50 $\mu$m. Microbeads can be provided in a very wide range of densities. Typically, average densities are about 600–6,000,000 beads/cm$^2$; preferably 40,000–6,000,000 beads/cm$^2$; more preferably 80,000–6,000,000 beads/cm$^2$; and most preferably 160,000–6,000,000 beads/cm$^2$. Other components can be added to the microbeads and substrate. For example, an adhesive layer may be coated onto the microbeads to form a Z-axis adhesive.

"Regular" is defined herein as having spacing of a defined or repeatable pattern.

"Discrete" is defined herein as meaning distinct elements that do not touch, such that each sphere, bead, or region does not touch a neighboring metal element.

DETAILED DESCRIPTION OF THE PRESENT INVENTION

The present invention provides a patterned array of metal microbeads and a method of making such a patterned array of metal microbeads. The method of the present invention is capable of providing microbeads on a substrate in a precise, regular array of uniform sizes, with extremely close center-to-center spacing of the microbeads. "Microbead" or "microsphere" will be used throughout to describe each individual discrete sphere-like metal element of an array of the present invention. The metal microspheres or microbeads are not likely to be perfectly spherical, but will have a flat portion. The microbeads will range from almost entirely spherical to lesser portions or segments of a sphere, such as hemispherical.

The flat portion of the bead may provide advantages in certain usages. A flat portion can assist in placement of a microbead on a secondary substrate with the flat portion acting as a base that may aid in providing electrical connection between two substrates. If an array of microbeads is transferred to a secondary substrate, for example, into an adhesive layer, the flat portions could remain exposed and also assist in providing electrical connection.

The method of the present invention can make microbeads of a single, uniform size, or of more than one size of beads. The arrays of the present invention include two general parts: the substrate and the metal microbeads, supported by the substrate. The arrays of the invention are made by a novel process by which the metal microbeads are formed on the substrate.

Figure 1:
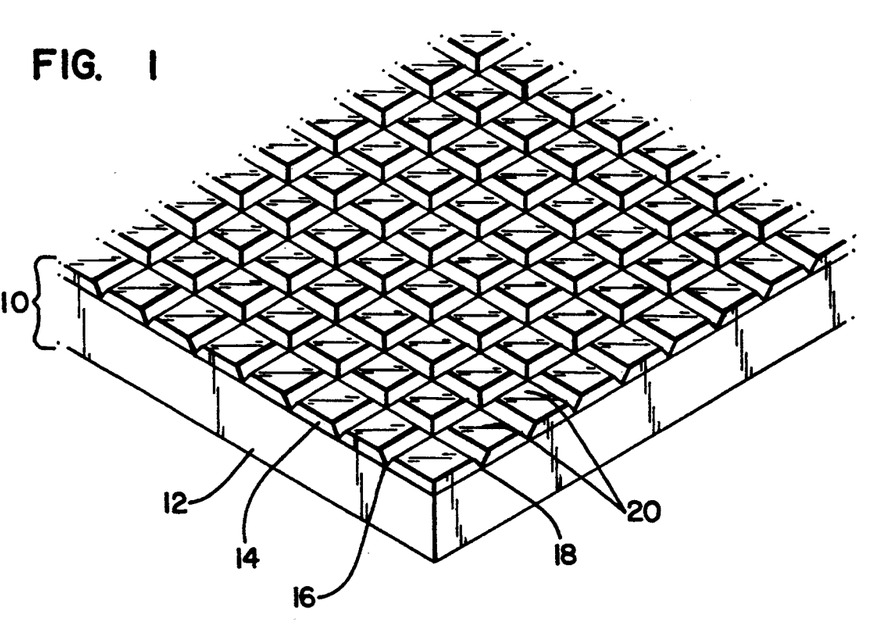
FIG. 1 is a perspective view of a metal coated polymer having the metal layer partitioned into metal regions, as part of the method of the present invention.

Referring to FIG. 1, a precursor of an array of metal microspheres of the present invention is shown, generally designated 10. The precursor of the array includes a substrate 12, and a metal layer 14. The metal layer 14 includes vertical grooves 16 and horizontal grooves 18, dividing the metal layer 14 into metal regions 20.

Figure 2:
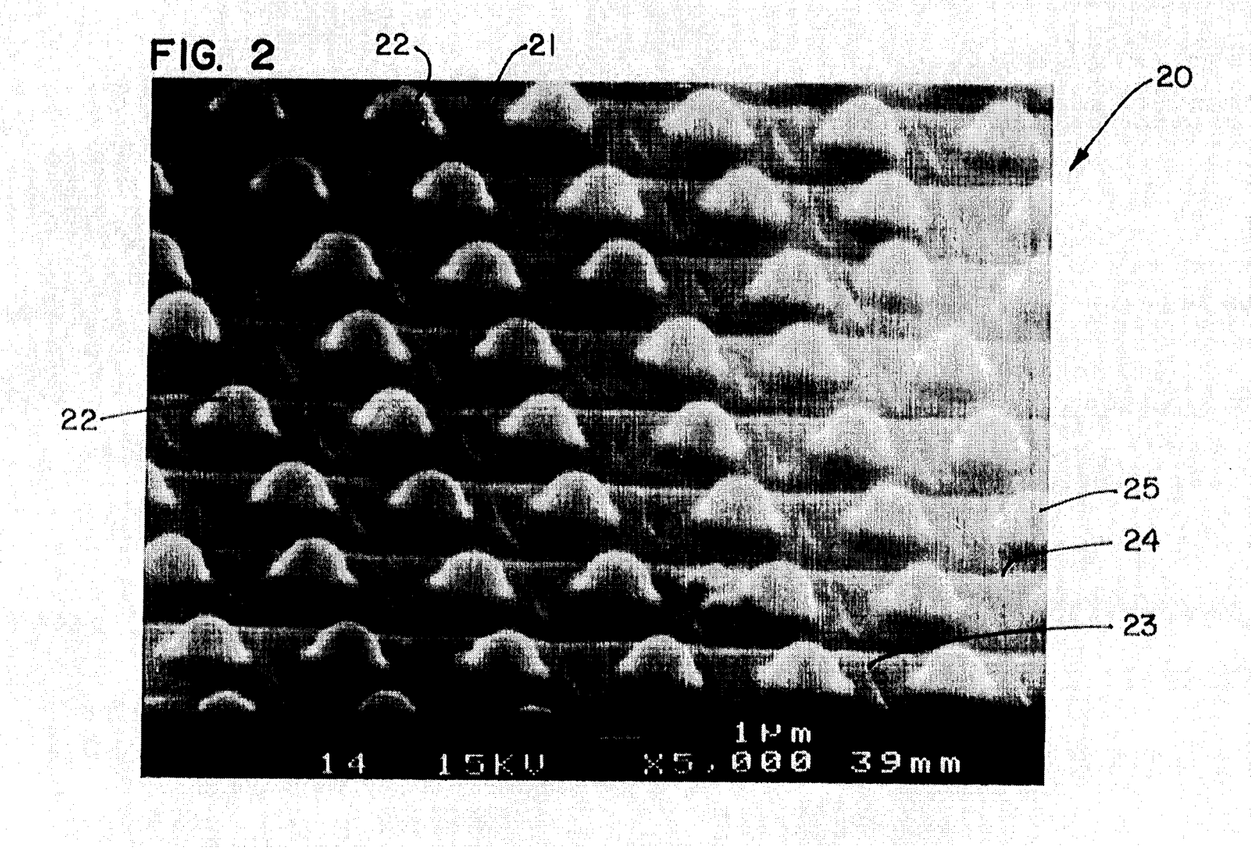
FIG. 2 is an electron micrograph showing a perspective view of an array of microbeads on a substrate of the present invention.

Referring to FIG. 2, a perspective view of an array of metal microspheres of the present invention is shown in the electron micrograph. The array is generally designated 20, including a substrate 21, with metal microspheres 22, provided thereon. The vertical grooves 23 and horizontal grooves 24 are shown in the substrate 21. The grooves are a result of the process of the present invention. The microspheres 22 typically include a spherical portion 25 and a flat portion (not shown) that is in contact with substrate 21.

Figure 3:
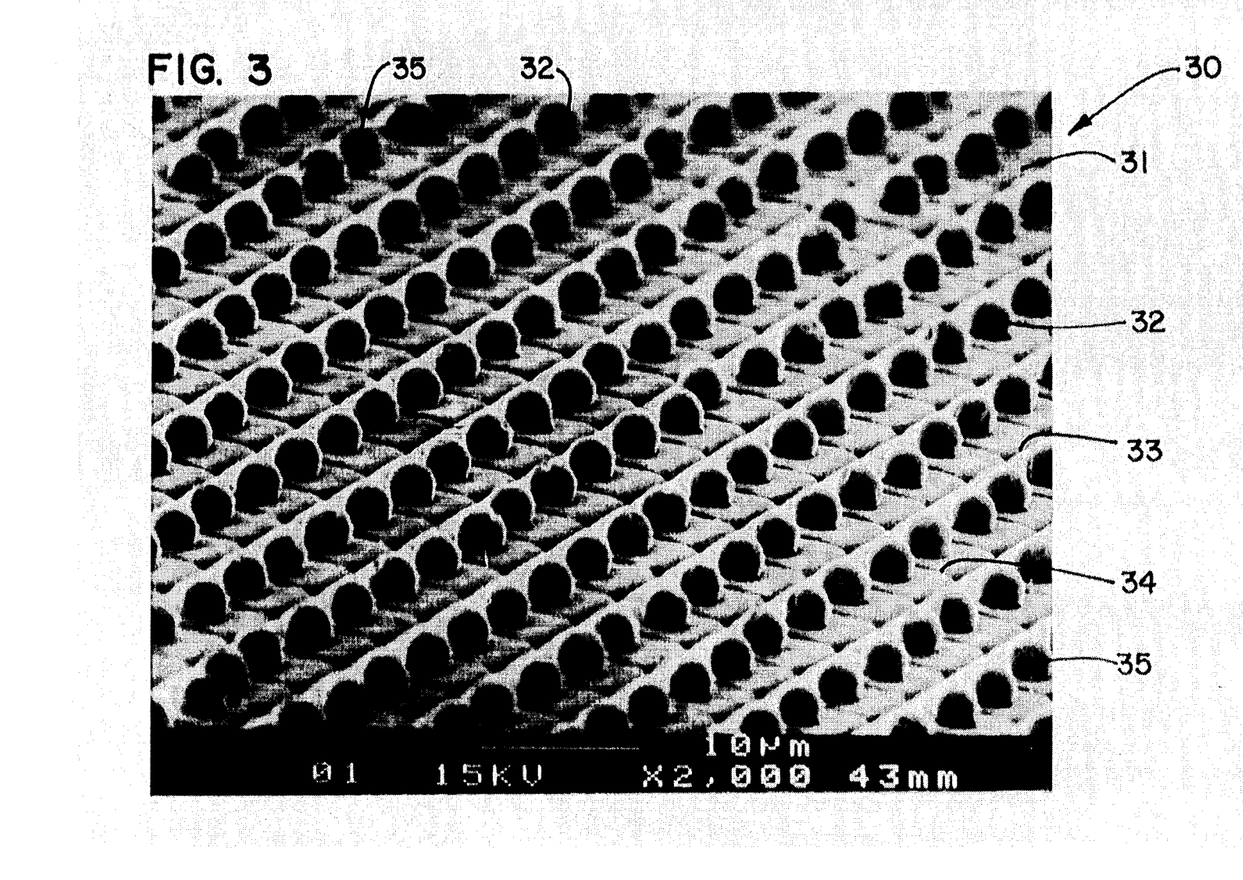
FIG. 3 is an electron micrograph showing a perspective view of an array of microbeads of the present invention.

Referring to FIG. 3, a perspective view of an array of metal microspheres of the present invention, generally designated 30, is shown. The electron micrograph shows an array 30, including a substrate 31, metal microspheres 32, vertical grooves 33, and horizontal grooves 34. The grooves are the result of the process of the present invention. The metal microspheres 32 include spherical portions 35 and flat portions (not shown). The microspheres 32 are more spherical in shape than the microspheres 22 shown in FIG. 2.

Figure 4:
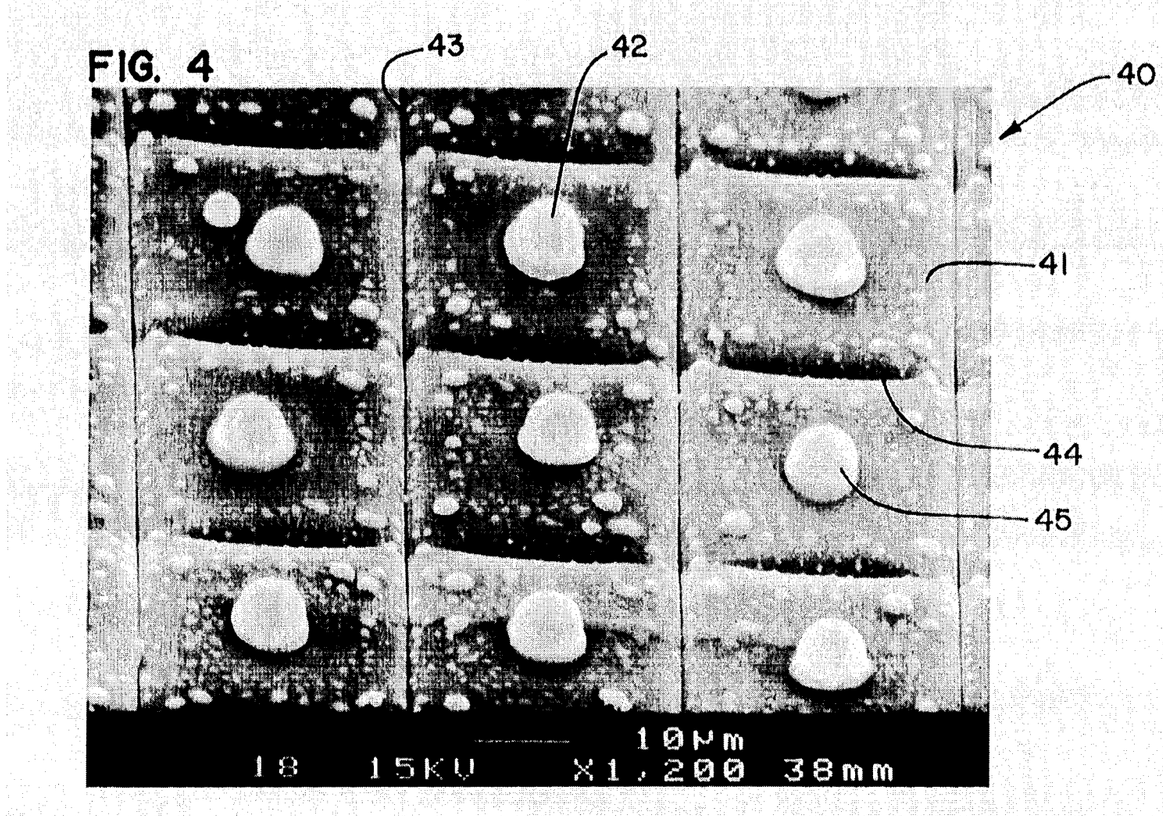
FIG. 4 is an electron micrograph showing a perspective view of an array of microbeads of the present invention.

Referring to FIG. 4, an electron micrograph showing a perspective view of an array of metal microspheres of the present invention is shown, the array generally designated 40. The array 40 includes a substrate 41, metal microspheres 42, vertical grooves 43, and horizontal grooves 44. The microspheres 42 include a spherical portion 45, and a flat portion (not shown) that is in contact with the substrate 41. FIG. 4 also shows that the microspheres are not perfect portions of a sphere sometimes having imperfections, including more bell-shaped microspheres.

Figure 5:
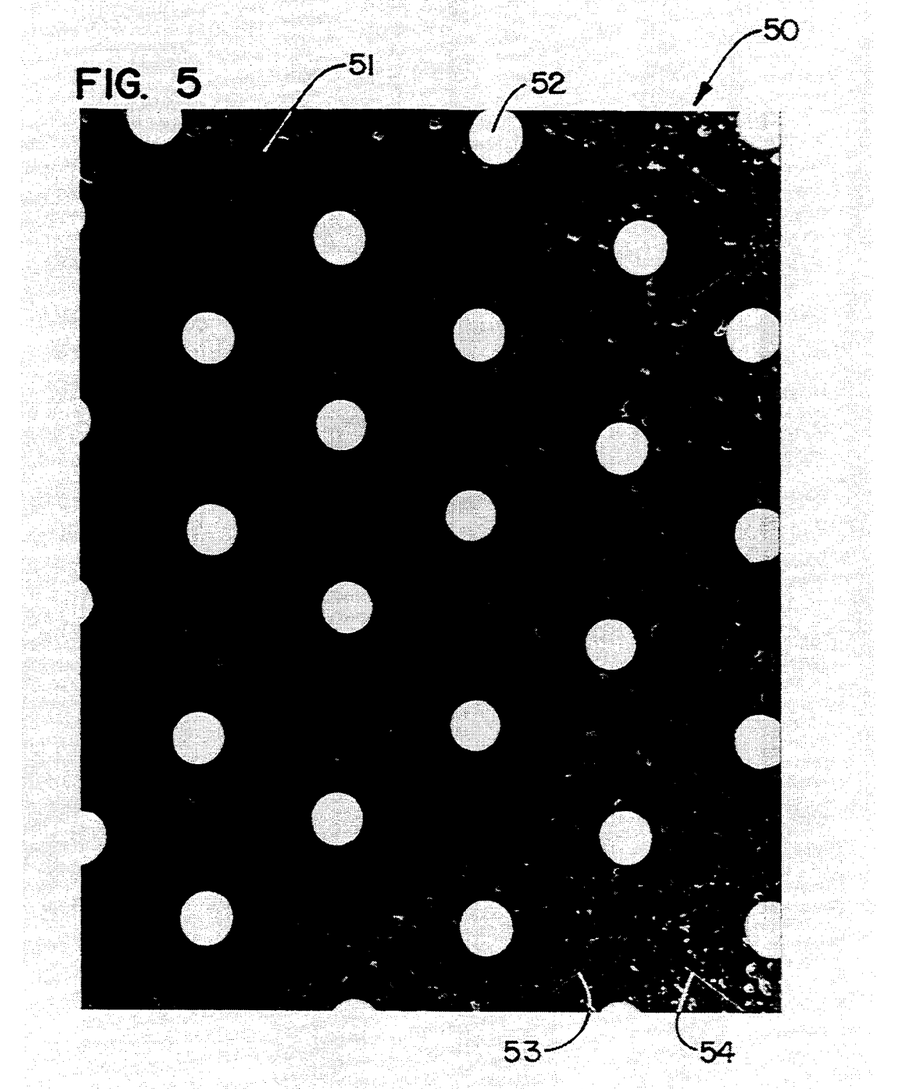
FIG. 5 is a photomicrograph showing a top view of an array of microbeads of the present invention.

Referring to FIG. 5, an array of metal microspheres of the present invention is shown, generally designated 50. The photomicrograph of FIG. 5 is a top view of the array 50, including a substrate 51, microspheres 52, first grooves 53, and second grooves 54. The grooves 53 and 54 form diamond shapes. The spherical nature of the microspheres 52 cannot be seen in the top view of the FIG. 5 photomicrograph, but the circular cross-section of the microspheres 52 is shown.

Substrate

A wide variety of materials may be used as substrates in the present invention. Many polymeric and non-polymeric materials are suitable as substrates.

A substrate which is suitable for use in the present invention should be selected in accordance with the needs of its end use. The substrate may be flexible or inflexible; transparent or opaque; made from a wide range of materials; have a wide variety of thicknesses and lateral dimensions; and have other characteristics suited to the particular end use. In many cases, the substrate may be used only as a carrier for the microbeads, or as a means on which to form the microbeads. The microbeads of the present invention can be used separately from the substrate, or used while adhered to the substrate.

To use the microbeads separately from the substrate, the microbeads must first be physically removed and collected. This can be accomplished by mechanically scraping or brushing the microbeads off of the substrate. After removal, the microbeads are freely moveable relative to one another. They can be dispersed in a liquid, preferably an adhesive, and coated on a second substrate. The result is an adhesive film coating containing a random dispersion of uniform microbeads. An application of this invention would be a Z-axis adhesive having microbeads of very uniform size and shape, in a randomly dispersed pattern.

Alternatively, the microbeads can be formed on a first substrate and then transferred to a second substrate; for example, including an adhesive layer. A substrate is selected based on the wetting characteristics of the metal to be used. The substrate selected should not be entirely wet by the liquid metal used to form the metal microbeads. In addition, a substrate should be selected which is not degraded by the temperatures experienced in processing. One of skill in the art will recognize that the polymer must remain intact and functional after the heating step.

The wettability of a liquid when placed onto a substrate is at least partially dependent on the surface tension between the liquid and the substrate. In general terms, the greater the surface tension, the greater the internal wetting angle between the droplet of liquid metal and the substrate. If the surface tension is sufficiently great, the liquid will form discrete droplets. Wetting refers to the tendency of a liquid to form a liquid film on a given surface, as opposed to non-wetting where the liquid forms individual discrete droplets on the surface.

In order to form the desired microbeads of the present invention, it is sufficient that the metal form discrete, liquid metal droplets on the surface of the substrate when the metal layer is melted. When this condition is satisfied, it will be referred to as a liquid metal which is non-wetting, or which does not wet a particular substrate surface. Depending on the desired shape of the microbead, the degree of wetting between a given substrate and a given metal can be selected so as to control the shape of the microbeads. The less the metal wets the substrate surface, the more spherical the bead.

Substrates chosen for use in the present invention should also be capable of withstanding the temperatures necessary to melt the metal layer in processing. Metal, glass, ceramic, and polymeric substrates are examples of useful substrates for use in the present invention. Examples of polymers that may be used as substrates in the present invention include: polyimides; polyphenylene oxides; polymers of fluorinated olefines such as polyterafluoroethylene; silicone polymers; cellulosic polymers; polyurethanes; engineering plastics such as polystyrene, styrene/acrylonitrile copolymers, copolymers containing polymerized styrene, acrylonitrile and butadiene (often called ABS polymers), styrene/butadine copolymers, rubber modified styrene polymers, styrene/maleic anhydride copolymers and similar polymers of monovinylidene aromatic carbocyclic monomers; polycarbonates including those made from phosgene and biphenol A and/or phenolphthalein; polyesters such as polyethylene terephthalate; acrylic resins such as poly(methyl methacrylate); polyamides such a nylon, polyolefins, such as polyethylene and polypropylene, polyvinyl halides such as polyvinylchloride and vinyldene chloride homopolymers and copolymers, polysulfones, polyarysulfones, and perfluorinated-ethylene-propylene copolymer.

In addition, metal substrates such as aluminum (typically wet by molten metals) coated with at least a thin non-wetting coating of aluminum oxide, or with another non-wetting coating, may be used. In general, substrates which are unsuitable for use because they are wet by the selected liquid metal may be coated with a non-wetting coating to provide a suitable depositing surface.

The thickness of the substrate is not particularly important to the practice of the present invention and should be determined by the characteristics and properties which are dictated by the end use for which the composite is designed. Such end use characteristics or properties includes: transparency, flexibility, tensile strength, corrosion resistance, and the like. In some cases, the substrate will not be used with the microbeads in the end use and will therefore be selected only for its processing characteristics.

Metal Microbeads

A wide variety of metals may be used. Examples of preferred metals for use in forming the metal microbeads of the present invention include tin, lead, bismuth, zinc, indium, aluminum, alloys (including alloys of these metals with metals of higher melting points, such as copper silver, gold, nickel, cobalt, iron), and mixtures thereof.

Like the substrate, the metal will be selected for its end use properties. The metal will also be selected based on its wetting characteristics of the substrate, as described above.

Fluxing Agent

A fluxing agent is used, as needed, in present invention. It is designed to penetrate the metal oxide layer that forms on the metal layer and to dissipate any metal oxide layer so that when the metal layer is melted, the metal will form discrete metal microspheres on the substrate.

A fluxing agent may not be needed if the processing conditions do not permit the formation of an oxide layer, such as under vacuum conditions.

Examples of suitable fluxing agents include organic acids, such as malic acid or acetic acid; chlorides, such as zinc chloride; phosphoric acid: dilute hydrochloric acid; other volatile acids; and other known fluxing agents. Fluxing agents are selected based on the particular metal and metal oxide used in the present invention.

The fluxing agent is used in a sufficient concentration to sufficiently dissipate any metal oxide layer to allow microsphere formation upon melting of the metal layer, but should be weak enough so that it does not dissolve, corrode, or otherwise degrade the substrate, or other components utilized. Preferably, the fluxing agent is volatile enough so that it will evaporate after it has performed the desired function. If the fluxing agent evaporates from the system, it will not present a risk of subsequent degradation to components of the composite. It is preferred that the fluxing agent be applied to the metal layer in the form of a fine mist.

Processing Parameters

The metal microbeads of the present invention are formed by providing a metal layer on a substrate that is sufficiently partitioned to permit beading, contacting the metal layer with an effective amount of a fluxing agent, if needed, and heating the metal layer to a temperature sufficient to melt the metal and to permit beading of the metal layer into discrete microbeads.

The process of the present invention involves first depositing a metal layer onto a substrate. A preferred method of deposition is through vacuum deposition. A metal vapor is formed in a vacuum chamber and a continuous layer of this metal is deposited onto a polymeric substrate. More than one layer of a single metal can be deposited to form the metal layer, as well as multiple layers of different metals.

A preferred method of forming the metal vapor in the vacuum is through one of several means of evaporation. Sputtering would also be suitable, albeit involving typically slower deposition rates.

A preferred form of evaporation is evaporation by means of heating the metal with an electron beam.. Typically, the metal is placed in a small water-cooled metal crucible and an electron beam is produced and focused on the metal in the crucible by means of a magnetic field. Typically, a beam consists of an electron current of about 0.1 to 1 amp accelerated by 10,000 volts, and directed to a 0.5 $cm^2$ spot on the metal. An electron beam power supply commercially available from Airco Temescal is an example of a suitable apparatus. Other methods of evaporating the metal or metals include resistance and induction heating.

After the metal vapor is created, the vapor moves through the vacuum chamber until it is deposited onto the substrate positioned above. The substrate may be a moving web that is passed through the metal vapor in the vacuum chamber at a speed sufficient to deposit a layer of the metal having a desired thickness. The thickness of the metal layer should be sufficiently thick relative to the width of the metal region after the partitioning to prevent multiple beads from forming in a given region. The minimum desired ratio will depend on the substrate and metal used, but in general terms, the thickness of the metal layer should be at least about 2% of the width or breadth of the metal region.

Depending on the substrate used, there are other methods for depositing a metal layer onto a substrate including, laminating a thin foil or membrane of the desired metal; spraying molten metal, electrolysis and/or electroplating of metal.

Before the metal layer is melted to form desired microbeads, the metal layer is provided on the substrate with metal regions formed in the metal layer in a desired pattern. The metal regions may be formed in a continuous metal layer by a partitioning step, or the metal may be provided on the substrate in the form of preformed metal regions. There are a number of means to provide the desired regions. The metal layer may be partitioned by means of, for example, laserscribing, photolithography, etching, mechanical scratching, cracking, or other means. Alternatively, the metal regions may be formed by vapor depositing the metal through a mask, or vapor depositing onto a substrate with a pre-embossed pattern such that the deposited coating is partitioned by shadowing, or line of sight deposition. The substrate can be pre-embossed with a pattern having different depths so as to provide microbeads on an embossed substrate provided at different depths. Whether deposited as a continuous metal layer and then partitioned, or deposited as metal regions, the regions need to be sufficiently partitioned to permit beading which does not necessarily require that the regions be discrete.

The metal regions may be of equal size or may be of one, two, or more different sizes so as to form microbeads of the same or varying sizes. The area of the metal layer and the thickness of the metal layer determine the size of the sphere, in conjunction with the wetting relationship between the metal and the substrate which defines the shape of the microbead. The metal layer may be partitioned into shapes including squares, triangles, diamond shapes, or other desired shapes to provide the desired microbead. For square metal regions, the bead diameter, assuming a perfect sphere, will be $(6ts^2\pi)^{\frac{1}{3}}$ where t is the thickness of coating and s is the width of the squares. For example, to produce microbeads of 2 $\mu$m in diameter, the initial coating should be 0.26 $\mu$m thick when the width of the squares is 4 $\mu$m.

After a metal layer is deposited on the polymeric substrate, the exposed surface of the metal layer will typically oxidize. The exposed surface of the metal means the side of the metal that is not in contact with the substrate. Oxidation of the exposed surface of the metal will occur by simply leaving the coated substrate in the presence of oxygen. When an oxide layer does form, the use of a fluxing agent is typically required.

A wide variety of patterns can be used co provide the desired spacing of spheres, sizes of spheres, and relative positioning of spheres. For example, a metal layer may be partitioned by two intersecting sets of parallel lines forming diamond shapes with the diamonds alternatingly bisected into triangles. The diamonds will form larger spheres and the triangles (half diamonds) will form smaller spheres.

The spacing of the microspheres is dependent on the size of the metal regions. The method of the present invention can produce microbeads having extremely precise and fine center-to-center spacing, e.g., 4 $\mu$m center-to-center spacing or 6,000,000 microbeads/cm$^2$. Typical densities for microbeads useful in Z-axis adhesives will be 40,000–1,000,000 microbeads/cm$^2$. One of the advantages of the method of the present invention is its ability to provide microbeads of a fine scale having precise spacing therebetween.

The thickness of the metal layer prior to melting will typically be 0.2–10 $\mu$m, more typically 0.2–2 $\mu$m.

The invention is further described by the following non-limiting examples.

EXAMPLE 1

A substrate having an array of microspheres of the present invention was made by providing a 25 $\mu$m thick by 18 cm wide by 10 meter long piece of polyimide (Dupont Kapton "H" film) that was vacuum coated with tin on one side by electron beam evaporation in a web coating chamber evacuated to $4 \times 10^{-5}$ Torr. The electron beam source was an Airco Temescal CV-14 power supply which provided a voltage of 9.4 kV and 0.13 A to melt and vaporize tin in a hearth charged with 200 grams of tin. The hearth of molten tin was 25 cm below a 40 cm diameter drum with which the web was in contact and which drove the web at a speed varying from 0.6 m/min to 16 m/min. Under these conditions the polyimide was coated with 0.5–0.02 $\mu$m of tin. A circular piece of the tin coated web 3.2 cm in diameter was cut from the web at a location where the tin thickness was 0.2 $\mu$m. This piece was embossed at room temperature in a hydraulic press using a nickel embossing die and a pressure of 28,000 psi or 190 MPa. The nickel die had a sawtooth pattern of parallel ridges with a 8 $\mu$m spacing and a 4 $\mu$m depth. The embossing step was repeated after turning the embossing die 90° so as to create an embossed pattern of 8 $\mu$m squares in the tin layer. The embossed tin coated polyimide sample was then exposed to HCl vapor by placing the sample over the top of a 150 ml beaker containing 1 ml of concentrated HCl for 5 seconds. This exposure to HCl vapor formed a very thick fog on the surface of the tin which acted as a flux to dissipate oxide during the melting step. The sample was then placed on a hot plate with a surface temperature of 280° C. for 2 seconds to melt the tin squares forming a square array of tin hemispheres which measured 3 $\mu$m in diameter and had a center-to-center spacing of 8 $\mu$m. The resulting array of spheres is illustrated in FIG. 3.

EXAMPLE 2

A second array of the present invention was provided by cutting a second piece of tin coated polyimide from the web of Example 1 from a region in which the tin coating was determined to be 0.07 $\mu$m in thickness. The metal layer was embossed in a manner similar to the method used in Example 1 except that the embossing tool had a sawtooth pattern of parallel ridges with 4 $\mu$m spacing. The embossed tin was exposed to HCl vapor in a manner similar to Example 1 and then heated to melt the tin. The embossed tin formed a square array pattern of beads which were approximately half spheres with a diameter of about 1.5 $\mu$m and a center-to-center spacing of 4 $\mu$m. The resulting pattern of hemispheres is illustrated in FIG. 2.

EXAMPLE 3

A third example of the present invention was made from a 25 $\mu$m thick by 18 cm wide by 5 $\mu$m piece of polyimide (Dupont Kapton "H" film) that was vacuum coated with tin on that the web speed was held constant at 0.7 m/min. The web was reversed after 4 $\mu$m and then reversed again after 2 $\mu$m. These reversals were repeated 10 more times so that a section of the web between 2 $\mu$m and 4 $\mu$m was coated with 12 layers of tin each roughly 0.5 $\mu$m thick. This procedure was necessary to produce a relatively thick coating of tin (6.5 $\mu$m) without overheating the polyimide substrate. A 3 cm by 3 cm sample was cut out of this web and embossed in a manner similar to that used in Example 1 except that a nickel tool which produced a diamond shaped embossed pattern was used The edges of the embossed pattern were spaced 400 $\mu$m apart. After fluxing and heating steps similar to Example 1, the resulting beads were found to have a diameter of 125 $\mu$m and a spacing of 400 μm. The resulting array of beads is shown in the photomicrograph of FIG. 5.

What is claimed is:

1. A method of providing an array of microspheres on a substrate, comprising the steps of:
    a) providing a metal layer on a substrate, said metal layer sufficiently partitioned into a plurality of metal regions to permit beading of the metal regions;
    b) heating said metal layer to a temperature sufficient to melt the metal regions and o permit beading of the metal regions into discrete microspheres, thereby providing an array of discrete microspheres on a substrate.

2. The method of claim 1 wherein the metal regions are provided by depositing said metal layer on said substrate followed by a step wherein said metal layer is partitioned into metal regions.

3. The method of claim 1 wherein said metal layer is deposited onto said substrate so as to be sufficiently partitioned into metal regions as deposited.

4. The method of claim 1 wherein said metal regions are defined by a first set of parallel grooves intersecting a second set of parallel grooves, such that said metal regions are parallelograms.

5. The metal of claim 1 wherein said metal regions have three sides.

6. The method of claim 1 wherein said metal layer has a thickness of about 0.2–10 μm.

7. The method of claim 6 wherein said metal layer has a thickness of about 0.2–2 μm.

8. The method of claim 1 further including the step of contacting said layer with an effective amount of a fluxing agent sufficient to permit beading of said metal regions.

9. The method of claim 1 wherein said microspheres are formed having an average density of about 600–6,000,000 beads/cm$^2$.

10. The method of claim 9 wherein said metal microspheres have an average density of about 40,000–6,000,000 beads/cm$^2$.

11. The method of claim 10 wherein said metal microspheres have an average density of about 80,000–6,000,000 beads/cm$^2$.

12. The method of claim 1 wherein said array of metal microspheres is a regular array.

13. The method of claim 1 wherein said metal regions are all of a single uniform surface area, thereby forming a regular array of microbeads of a single size.

14. The method of claim 1 wherein said metal regions have 2 or more uniform sizes.

15. The method of claim 1 wherein the diameter of said microspheres is about 0.2–100 μm.

16. The method of claim 15 wherein the diameter of said microspheres is about 1–50 μm.

17. The method of claim 1 further including a step of transferring said array of metal microspheres to a second substrate.

18. The method of claim 17 further including an adhesive layer on said second substrate with said array of metal microspheres transferred into said adhesive layer.

* * * * *

UNITED STATES PATENT AND TRADEMARK OFFICE
CERTIFICATE OF CORRECTION

PATENT NO. : 5,366,140
DATED : November 22, 1994
INVENTOR(S) : David C. Koskenmaki and Clyde D. Calhoun It is certified that error appears in the above-indentified patent and that said Letters Patent is hereby corrected as shown below:

Column 5, line 46, "copper silver" should read --copper, silver--.

Column 5, line 54, "in present" should read --in the present--.

Column 7, line 41, "co" should read --to--.

Column 9, line 11, "o" should read --to--.

Signed and Sealed this

Thirteenth Day of June, 1995

Attest:

BRUCE LEHMAN

Attesting Officer     Commissioner of Patents and Trademarks